(12) United States Patent
Yin et al.

(10) Patent No.: US 6,770,541 B1
(45) Date of Patent: Aug. 3, 2004

(54) METHOD FOR HARD MASK REMOVAL FOR DEEP TRENCH ISOLATION AND RELATED STRUCTURE

(75) Inventors: Kevin Q. Yin, Irvine, CA (US); Amol Kalburge, Irvine, CA (US)

(73) Assignee: Newport Fab, LLC, Newport Beach, CA (US)

(*) Notice: Subject to any disclaimer, the term of this patent is extended or adjusted under 35 U.S.C. 154(b) by 0 days.

(21) Appl. No.: 10/371,416

(22) Filed: Feb. 20, 2003

(51) Int. Cl.⁷ .............................................. H01L 21/76
(52) U.S. Cl. ..................... 438/424; 438/426; 438/453
(58) Field of Search .............................. 438/424–439, 438/453, 444, 430–432, 361, 248; 257/510, 506, 520

(56) References Cited

U.S. PATENT DOCUMENTS

| | | | | |
|---|---|---|---|---|
| 4,871,685 A | * | 10/1989 | Taka et al. .................. | 438/361 |
| 5,106,777 A | * | 4/1992 | Rodder ........................ | 438/426 |
| 5,306,940 A | * | 4/1994 | Yamazaki .................... | 257/374 |
| 5,348,906 A | * | 9/1994 | Harajiri ...................... | 438/430 |
| 6,406,972 B2 | * | 6/2002 | Norstrom et al. ........... | 438/404 |

* cited by examiner

Primary Examiner—Phat X. Cao
Assistant Examiner—Theresa T. Doan
(74) Attorney, Agent, or Firm—Farjami & Farjami LLP

(57) ABSTRACT

According to an exemplary method for removing a hard mask in a deep trench isolation process, a hard mask is formed over the substrate, where the substrate includes at least one field oxide region. Thereafter, a trench is formed in the substrate, where the trench has a first sidewall and a second sidewall. According to this exemplary embodiment, the hard mask is removed after forming the trench. The hard mask may be removed by, for example, etching the hard mask in an anisotropic dry etch process, where the anisotropic dry etch process is selective to nitride and silicon. Next, an oxide liner is deposited by a CVD process on the first and second sidewalls of the trench and over the substrate after the hard mask has been removed.

7 Claims, 8 Drawing Sheets

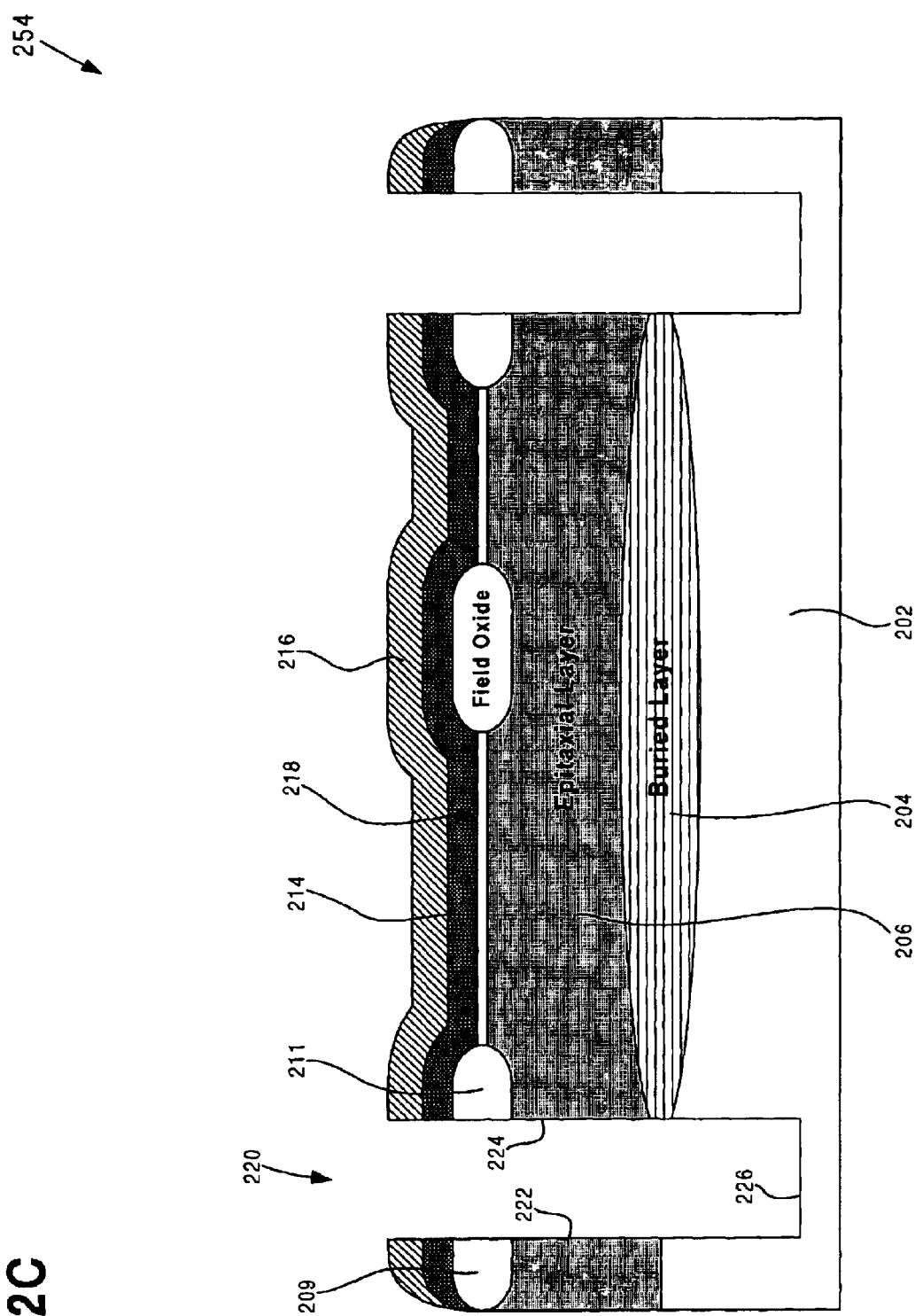

METHOD FOR HARD MASK REMOVAL FOR DEEP TRENCH ISOLATION AND RELATED STRUCTURE

BACKGROUND OF THE INVENTION

1. Field of the Invention

The present invention relates to the field of fabrication of semiconductor devices. More specifically, the invention relates to forming isolation regions in semiconductor substrates.

2. Background Art

In a Bipolar Complementary-Metal-Oxide-Semiconductor ("BiCMOS") process, deep trench isolation regions are typically formed to provide isolation between adjacent active regions of a semiconductor substrate. A deep trench isolation region may electrically isolate, for example, a bipolar transistor, such as a silicon-germanium heterojunction bipolar transistor, from an adjacent CMOS transistor, such as a PFET, fabricated on the same semiconductor substrate. Deep trench isolation regions may be formed on a substrate after formation of, for example, field oxide isolation regions, a buried layer, and an epitaxial layer of silicon.

In a typical conventional deep trench isolation process, a layer of silicon nitride ("nitride") is deposited on a silicon substrate at a thickness of approximately 1500 Angstroms, for example. A hard mask having an approximate thickness of 4500 Angstroms and comprising densified tetraethylorthosilicate ("TEOS") oxide or high-density plasma ("HDP") oxide is then formed over the nitride layer. A photoresist mask is formed and patterned over the hard mask, and a trench is etched to a depth just below a field oxide region. After removal of the photoresist mask, the trench is further etched into the silicon substrate to a depth of between approximately 7.0 and 10.0 microns. During trench etching, the hard mask is also etched, which results in a reduction in hard mask thickness by approximately one half. After performance of cleaning and other preparatory steps as known in the art, a densified TEOS oxide liner is formed on the sidewalls of the trench and on the surface of the silicon substrate. The TEOS oxide liner may have a thickness of approximately 1000.0 Angstroms or greater.

Next, in the conventional deep trench isolation process discussed above, a conformal layer of polycrystalline silicon (also referred to as polysilicon) is deposited over the silicon substrate and trench. The layer of polysilicon is then recess etched in the trench to a depth of approximately 1500.0 Angstroms below the interface of the field oxide region and the nitride layer. The hard mask situated over the layer of nitride is then removed in a wet etch process utilizing a buffered oxide etchant ("BOE"). However, since the polysilicon is recess etched to a depth of approximately 1500.0 Angstroms below the nitride layer, the BOE wet etch causes severe lateral etching of the field oxide region situated on the sidewalls of the trench.

In an attempt to reduce the severe field oxide lateral etching discussed above, semiconductor manufacturers have utilized a dry etch in place of the BOE wet etch. However, mainly as a result of non-uniformity in hard mask thickness resulting from etching of the hard mask during trench formation, the dry etch approach causes formation of a non-uniform "mini-trench" or cavity on either side of the polysilicon-filled trench. As a result, removal of the hard mask utilizing either the BOE wet etch or the dry etch approach causes undesirable deep mini-trenches or cavities to be formed in the field oxide.

Another approach utilizes a chemical-mechanical-polishing ("CMP") step after polysilicon deposition to remove the hard mask. However, the CMP approach is a costly approach that is limited in application to shallow trench isolation technology.

Thus, there is a need in the art for an effective method for removing a hard mask in a deep trench isolation process.

SUMMARY OF THE INVENTION

The present invention is directed to method for hard mask removal for deep trench isolation and related structure. The present invention addresses and resolves the need in the art for an effective method for removing a hard mask in a deep trench isolation process.

According to an exemplary method for removing a hard mask in a deep trench isolation process in one embodiment of the present invention, a hard mask is formed over the substrate, where the substrate includes at least one field oxide region. The hard mask may be formed over a layer of nitride situated over the substrate, for example. The hard mask may be, for example, densified TEOS oxide and HDP oxide. Thereafter, a trench is formed in the substrate, where the trench has a first sidewall and a second sidewall. The trench may be formed by forming a photoresist mask on the hard mask, etching a trench to an initial depth, removing the photoresist mask, and etching the trench to a final depth, for example.

According to this exemplary embodiment, the hard mask is removed after forming the trench. The hard mask may be removed by, for example, etching the hard mask in an anisotropic dry etch process, where the anisotropic dry etch process is selective to nitride and silicon. Next, an oxide liner is deposited by a CVD process on the first and second sidewalls of the trench and over the substrate after the hard mask has been removed. The oxide liner may be densified TEOS oxide, for example. The oxide liner may be removed using a wet strip process, for example. According to one embodiment, the invention is a structure that is achieved by utilizing the above-described method. Other features and advantages of the present invention will become more readily apparent to those of ordinary skill in the art after reviewing the following detailed description and accompanying drawings.

BRIEF DESCRIPTION OF THE DRAWINGS

FIG. 2C illustrates cross-sectional views, which include portions of a wafer processed according to an embodiment of the invention, corresponding to certain steps of the flowchart in FIG. 1.

DETAILED DESCRIPTION OF THE INVENTION

The present invention is directed to method for hard mask removal for deep trench isolation and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

The present invention involves a deep trench isolation process that provides effective removal of a hard mask that is utilized in the formation of deep trench isolation regions in a silicon substrate. As will be discussed in detail below, the present invention's innovative process results in minimal damage to field oxide regions situated over deep trench isolation regions. The innovative process of the present invention can be applied in, for example, BiCMOS applications to achieve effective formation of deep trench isolation regions.

Figure 1:
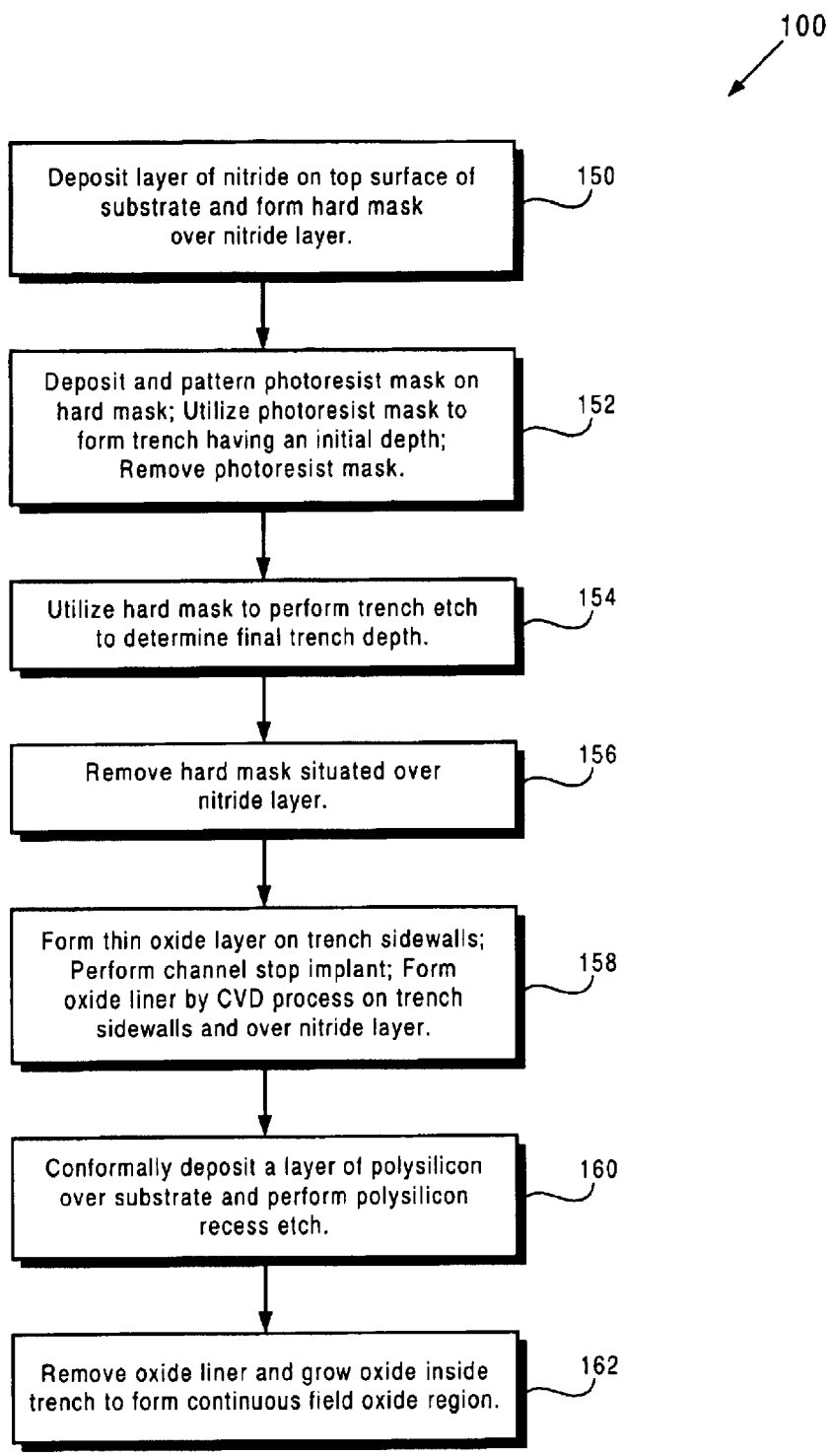
FIG. 1 shows a flowchart illustrating the steps taken to implement an embodiment of the present invention.

FIG. 1 shows a flowchart illustrating an exemplary method according to an embodiment of the present invention. Certain details and features have been left out of flowchart 100 that are apparent to a person of ordinary skill in the art. For example, a step may consist of one or more substeps or may involve specialized equipment or materials, as known in the art. Steps 150 through 162 indicated in flowchart 100 are sufficient to describe one embodiment of the present invention, other embodiments of the invention may utilize steps different from those shown in flowchart 100. It is noted that the processing steps shown in flowchart 100 are performed on a wafer, which, prior to step 150, includes field oxide regions, a buried layer, and an epitaxial layer situated over the buried layer.

Moreover, structures 250 through 262 in FIGS. 2A through 2G illustrate the result of performing, on the semiconductor structure discussed above, steps 150 through 162 of flowchart 100, respectively. For example, structure 250 shows the semiconductor structure discussed above after processing step 150, structure 252 shows structure 250 after the processing of step 152, structure 254 shows structure 252 after the processing of step 154, and so forth. It is noted that although formation of only one deep trench isolation region is specifically discussed herein to preserve brevity, multiple deep trench isolation regions can be formed in a substrate utilizing the innovative process of the present invention.

Figure 2A:
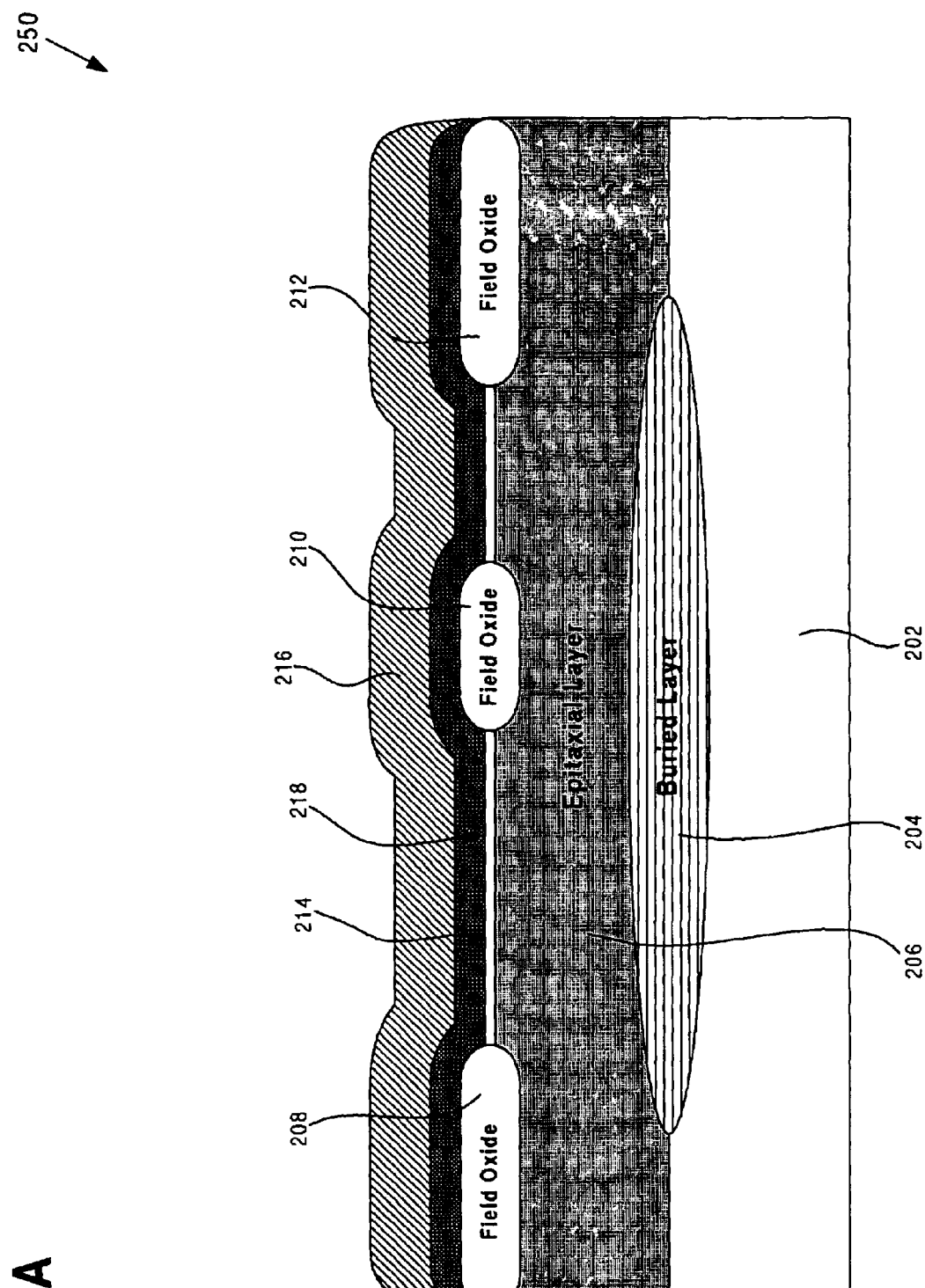
FIG. 2A illustrates cross-sectional views, which include portions of a wafer processed according to an embodiment of the invention, corresponding to certain steps of the flowchart in FIG. 1.

Referring now to FIG. 2A, structure 250 of FIG. 2A shows an exemplary structure including a silicon substrate that includes field oxide regions, a buried layer, and an epitaxial layer, after completion of step 150 of flowchart 100 in FIG. 1. In structure 250, buried layer 204, epitaxial layer 206, and field oxide regions 208, 210, and 212 are formed in silicon substrate 202. Buried layer 204 is formed in silicon substrate 202 in a manner known in the art and can comprise, for example, heavily doped N-type material. Epitaxial layer 206 can comprise single-crystal silicon, which can be epitaxially grown on silicon substrate 202 in a manner known in the art. Field oxide regions 208, 210, and 212 comprise silicon oxide and may be formed in silicon substrate 202 in a manner known in the art.

Continuing with step 150 in FIG. 1 and structure 250 in FIG. 2A, at step 150 of flowchart 100, silicon nitride ("nitride") layer 214 is deposited on top surface 218 of silicon substrate 202 and hard mask 216 is formed on nitride layer 214. Nitride layer 214 can be formed, for example, by depositing a layer of nitride on top surface 218 of silicon substrate 202 in a low pressure chemical vapor deposition ("LPCVD") process and can have a thickness of approximately 1500.0 Angstroms, for example. Hard mask 216 can comprise densified oxide, which can be formed by depositing TEOS oxide on nitride layer 214 in an LPCVD process and densifying the TEOS oxide in a mariner known in the art. In one embodiment, hard mask 216 can comprise high-density plasma ("HDP") oxide. The thickness of hard mask 216 can be, for example, approximately 4500.0 Angstroms. The result of step 150 of flowchart 100 is illustrated by structure 250 in FIG. 2A.

Figure 2B:
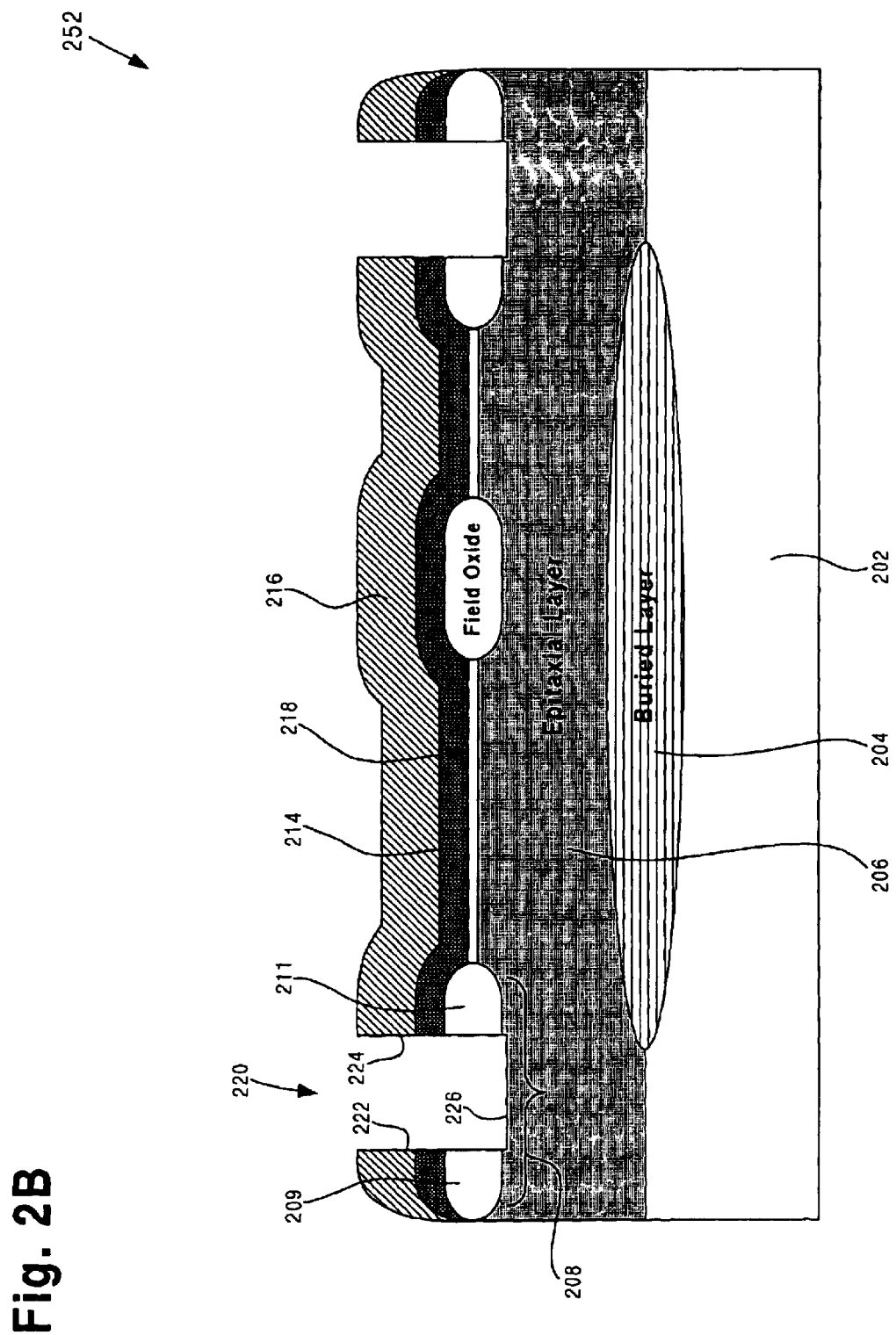
FIG. 2B illustrates cross-sectional views, which include portions of a wafer processed according to an embodiment of the invention, corresponding to certain steps of the flowchart in FIG. 1.

Referring to step 152 in FIG. 1 and structure 252 in FIG. 2B, at step 152 of flowchart 100, a photoresist mask is deposited and patterned on hard mask 216, the patterned photoresist mask is utilized to form trench 220 having an initial depth, and the photoresist mask is then removed. The photoresist mask can be deposited and patterned on hard mask 216 in a manner known in the art to achieve a trench opening in the photoresist mask having a width substantially equal to a critical dimension ("CD"). In a first etch step, trench 220 can be formed by utilizing an etchant such as CF4/CHF3/Ar or other appropriate etchant and adjusting the etchant chemistry to sequentially etch through hard mask 216, nitride layer 214, field oxide region 208, and etch a short distance into epitaxial layer 206. The resulting trench 220 formed by the etch step discussed above defines sidewalls 222 and 224 and bottom surface 226. Bottom surface 226 of trench 220 can extend into epitaxial layer 206 to an initial depth a short distance below field oxide region 208. Field oxide portions 209 and 211, which are situated adjacent to sidewalls 222 and 224, respectively, are formed as a result of the etch step discussed above.

In a second etch step, the photoresist mask can be removed from hard mask 216 and polymer residue formed as a result of the first etch step discussed above can be removed from sidewalls 222 and 224 of trench 220 in a wet strip utilizing an appropriate etchant as known in the art. The width of trench 220 is determined by the CD of the trench opening patterned in the photoresist mask discussed above, and can be, for example, approximately 1.0 micron. The result of step 152 of flowchart 100 is illustrated by structure 252 in FIG. 2B. It is noted that in FIG. 2B and in subsequent figures, only trench 220 is specifically discussed to preserve brevity.

Referring to step 154 in FIG. 1 and structure 254 in FIG. 2C, at step 154 of flowchart 100, hard mask 216 is utilized to perform a trench etch to define a final depth of trench 220.

The trench etch can be performed by utilizing an appropriate etchant to etch silicon in epitaxial layer 206 to increase the depth of trench 220 to a final depth of, for example, approximately 7.0 microns. In one embodiment, the trench etch discussed above can be utilized to increase the depth of trench 220 to a final depth of between approximately 3.0 and approximately 7.0 microns. During the trench etch, a portion of hard mask 216 is also removed, which reduces the thickness of hard mask 216 by approximately one half. By way of example, hard mask 216 can be reduced from an initial thickness of approximately 4500.0 Angstroms to a thickness of approximately 2250.0 Angstroms as a result of the trench etch. After performance of the trench etch discussed above, a post trench clean can be performed by utilizing a diluted HF dip or other appropriate etchant to remove approximately 200.0 Angstroms of oxide from sidewalls 222 and 224 of trench 220. The result of step 154 of flowchart 100 is illustrated by structure 254 in FIG. 2C.

Figure 2D:
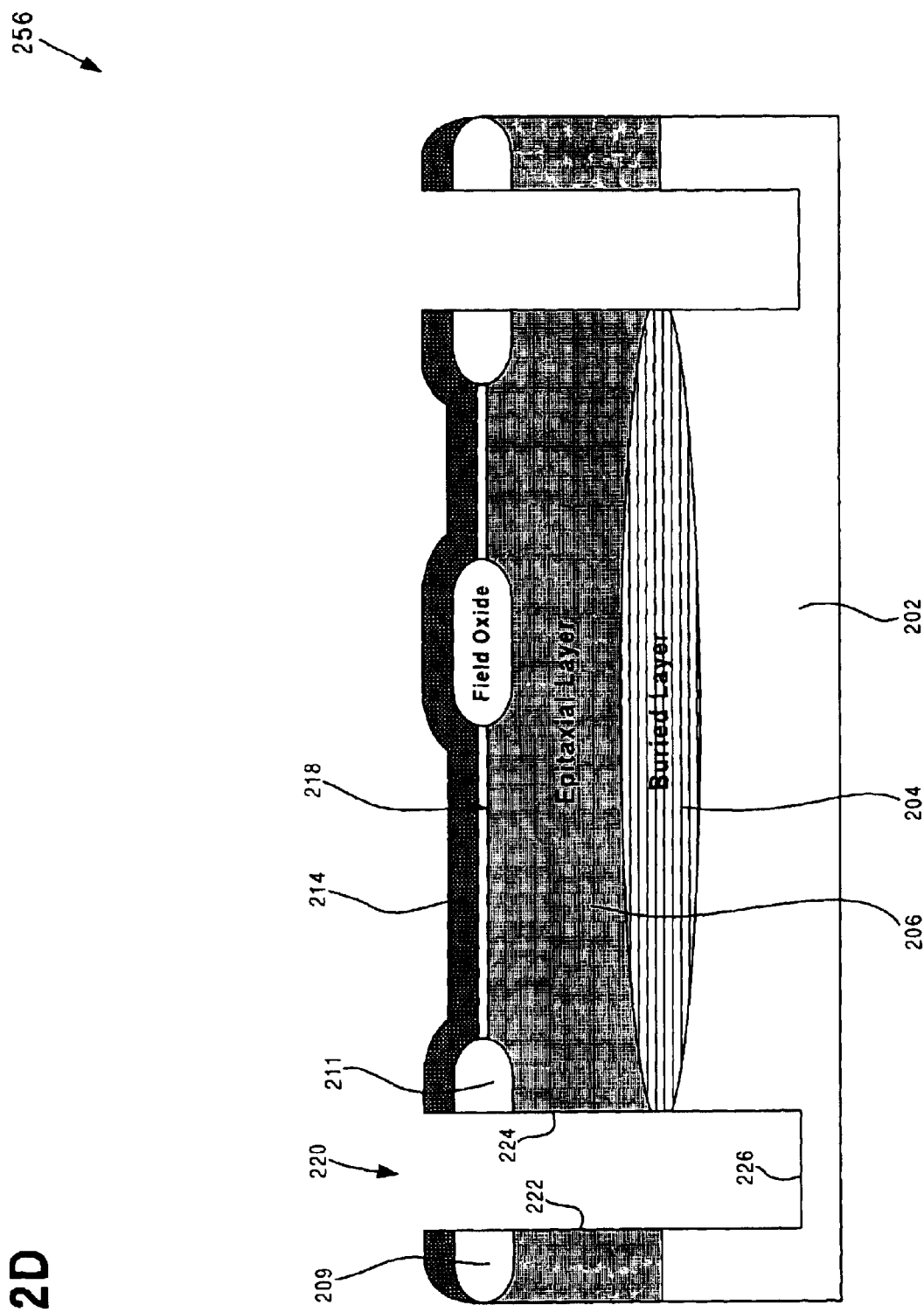
FIG. 2D illustrates cross-sectional views, which include portions of a wafer processed according to an embodiment of the invention, corresponding to certain steps of the flowchart in FIG. 1.

Referring to step 156 in FIG. 1 and structure 256 in FIG. 2D, at step 156 of flowchart 100, hard mask 216 is removed. In the present embodiment, hard mask 216 can be removed in an anisotropic dry etch process that is selective to silicon and nitride and utilizes an etchant such as C4F8/CO/Ar or other appropriate etchant. As a result of the high selectivity of the anisotropic dry etch process, the etchant does not significantly damage nitride layer 214 or silicon situated at bottom surface 226 of trench 220. By way of example, the anisotropic dry etch process causes a loss of less than 100.0 Angstroms of nitride in nitride layer 214. By utilizing an anisotropic dry etch to remove hard mask 216, the present invention can maintain a uniform trench width of approximately 1.0 micron, for example. In contrast, in a process utilizing a wet etch to remove hard mask 216, portions of field oxide 208 can be etched, which can undesirably alter the shape of trench 220. After removal of hard mask 216, sidewalls 222 and 224 of trench 220 can be cleaned by utilizing, for example, a plasma etch and an HF strip to remove polymer by-products formed on sidewalls 222 and 224 during etching of hard mask 216. By removing hard mask 216 after formation of trench 220 utilizing an anisotropic dry etch process, the present invention advantageously achieves effective hard mask removal without undesirably etching field oxide portions 209 and 211. The result of step 156 of flowchart 100 is illustrated by structure 256 in FIG. 2D.

Figure 2E:
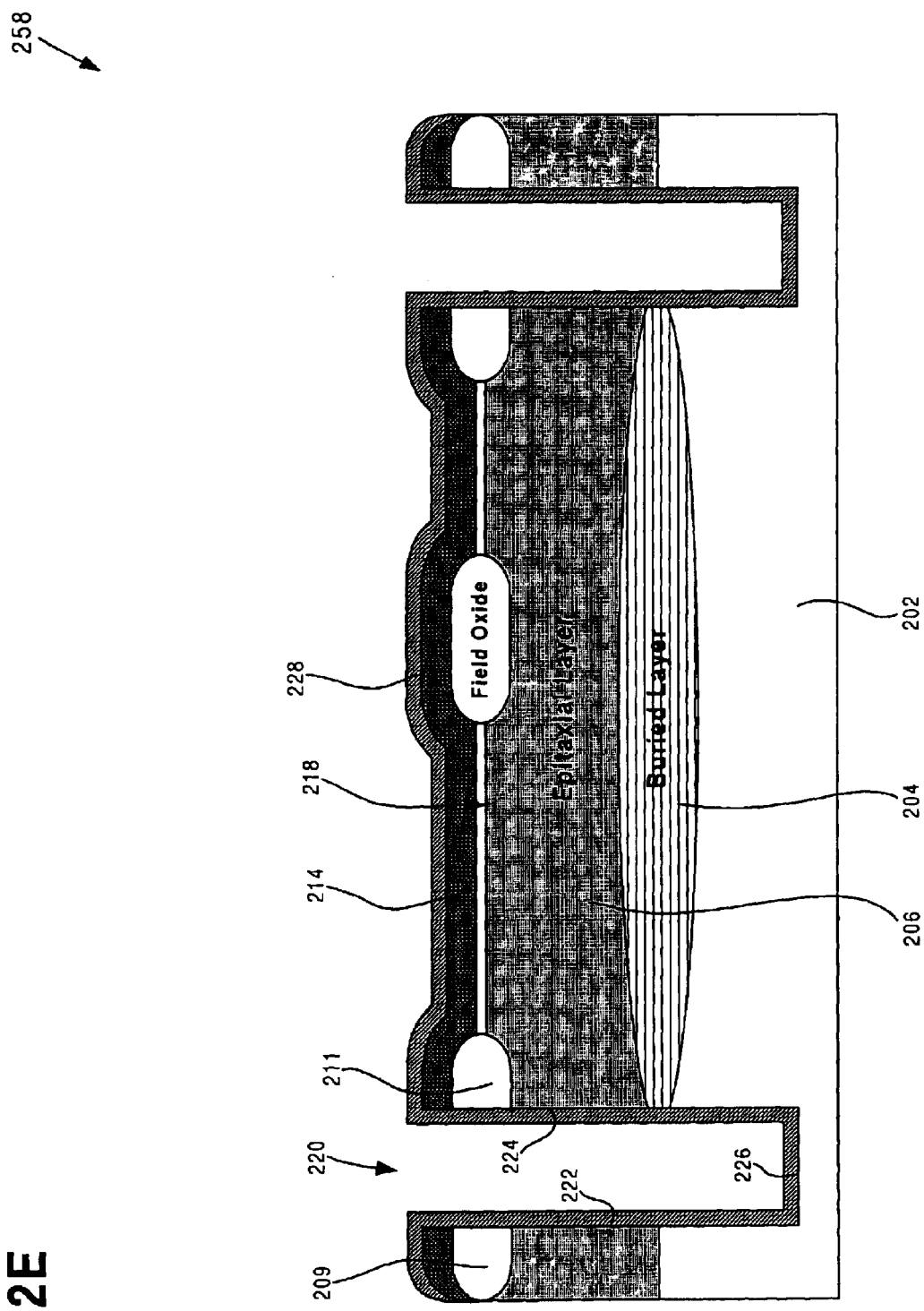
FIG. 2E illustrates cross-sectional views, which include portions of a wafer processed according to an embodiment of the invention, corresponding to certain steps of the flowchart in FIG. 1.

Referring to step 158 in FIG. 1 and structure 258 in FIG. 2E, at step 158 of flowchart 100, a thin silicon oxide ("thin oxide") layer (not shown) is formed on sidewalls 222 and 224 of trench 220, a channel stop implant is performed, and silicon oxide ("oxide") liner 228 is formed by chemical vapor deposition ("CVD") process on sidewalls 222 and 224 and bottom surface 226 of trench 220 and over nitride layer 214 situated on substrate 202. The thin oxide layer (not shown) can be formed, for example, by growing oxide on sidewalls 222 and 224 and bottom surface 226 of trench 220 and can have an approximate thickness of 400.0 Angstroms, for example. The thin oxide layer (not shown) can be utilized to remove damage caused by prior etching processes and can function as screen oxide to protect exposed silicon surfaces from damage from a subsequent channel stop implant, for example.

In the channel stop implant performed in step 158, a dopant such as boron, for example, can be implanted in bottom surface 226 of trench 220 to prevent current leakage. A wet strip can be performed to eliminate carbon and metal contamination resulting from the channel stop implant. Also, prior to forming oxide liner 228 in a CVD process, a thirty-second HF preclean can be performed to appropriately clean sidewalls 222 and 224 and bottom surface 226 of trench 220.

Next, oxide liner 228, also referred to as a "CVD oxide liner" in the present application, is formed by depositing a layer of TEOS oxide on sidewalls 222 and 224 and bottom surface 226 of trench 220 and over nitride layer 214 on top surface 218 of substrate 202. The layer of TEOS oxide can be deposited in an LPCVD process or other appropriate CVD process as known in the art. The layer of TEOS oxide can be densified by utilizing, for example, a temperature of approximately 750° C. and an inert gas such as nitrogen to complete formation of oxide liner 228. The thickness of oxide liner 228 can be chosen to minimize the size of cavities formed in field oxide as a result of removal of oxide liner 228 in a subsequent step. Oxide liner 228 can have a thickness of, for example, approximately 1000.0 Angstroms. The result of step 158 of flowchart 100 is illustrated by structure 258 in FIG. 2E.

Figure 2F:
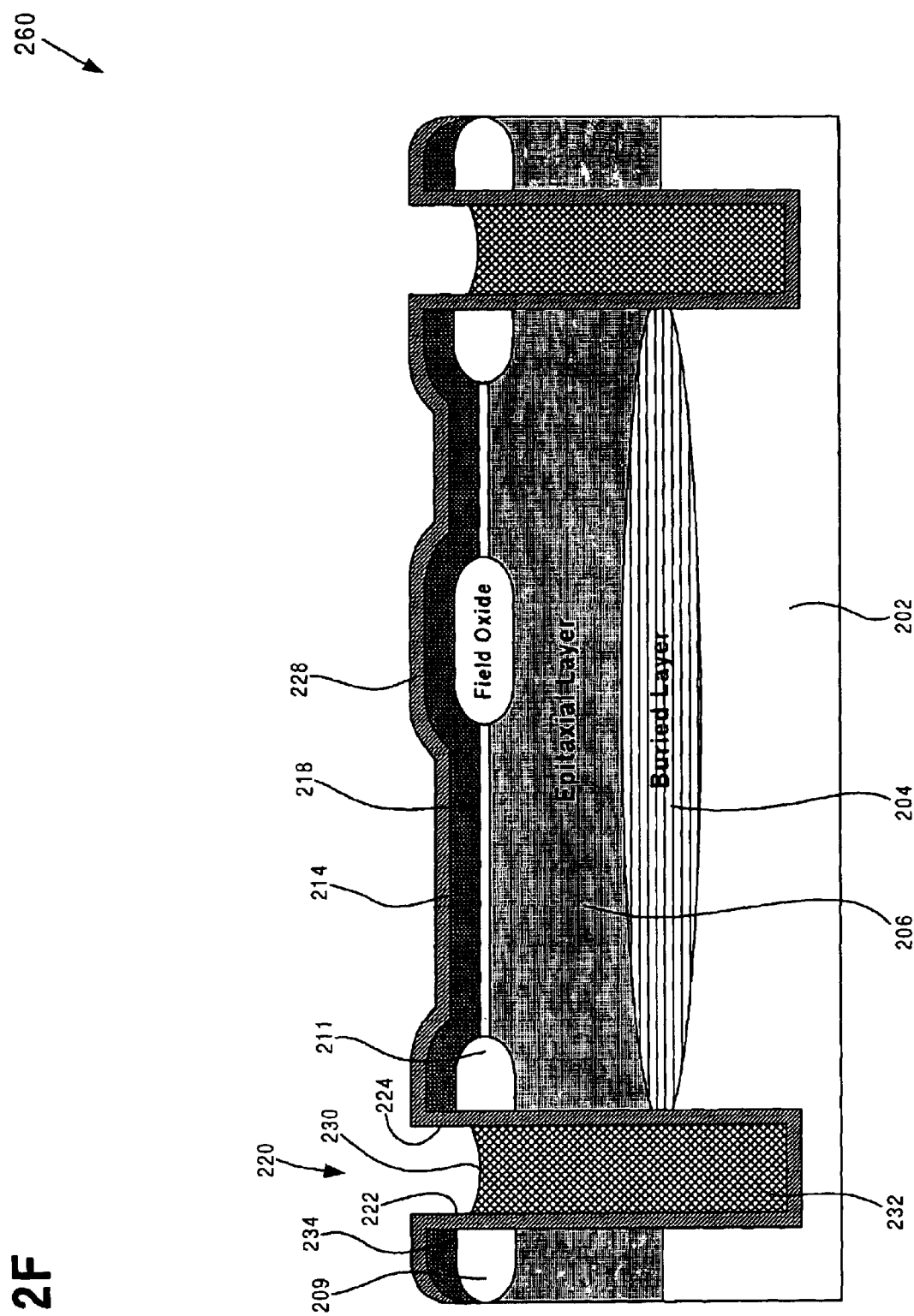
FIG. 2F illustrates cross-sectional views, which include portions of a wafer processed according to an embodiment of the invention, corresponding to certain steps of the flowchart in FIG. 1.

Referring to step 160 in FIG. 1 and structure 260 in FIG. 2F, at step 160 of flowchart 100, a layer of polysilicon is conformally deposited over substrate 202 and etched in an etch back process. The layer of polysilicon can be conformally deposited over substrate 202 at a thickness of, for example, approximately 1.5 microns. As a result of the conformal polysilicon deposition process, deposited polysilicon fills trench 220. In the etch back process, a breakthrough etch is first performed utilizing, for example, a CF4 etch chemistry to break through an oxide skin that is usually formed on the layer of polysilicon. Next, a main etch is performed utilizing, for example, an SF6/O2 etch chemistry, followed by an over etch utilizing, for example, a Cl2/HBr etch chemistry. As a result of the etch back process discussed above, the layer of polysilicon is etched back to depth 230 inside trench 220 to form polysilicon portion 232. Depth 230 can be, for example, approximately 1500.0 Angstroms below interface 234, which is situated at a boundary of field oxide portion 209 (or field oxide portion 211) and nitride layer 214. Since the respective etch chemistries utilized to perform the main etch and the over etch discussed above are highly selective to oxide, minimal etching of densified oxide in oxide liner 228 occurs during the polysilicon etch back process. The result of step 160 of flowchart 100 is illustrated by structure 260 in FIG. 2F.

Figure 2G:
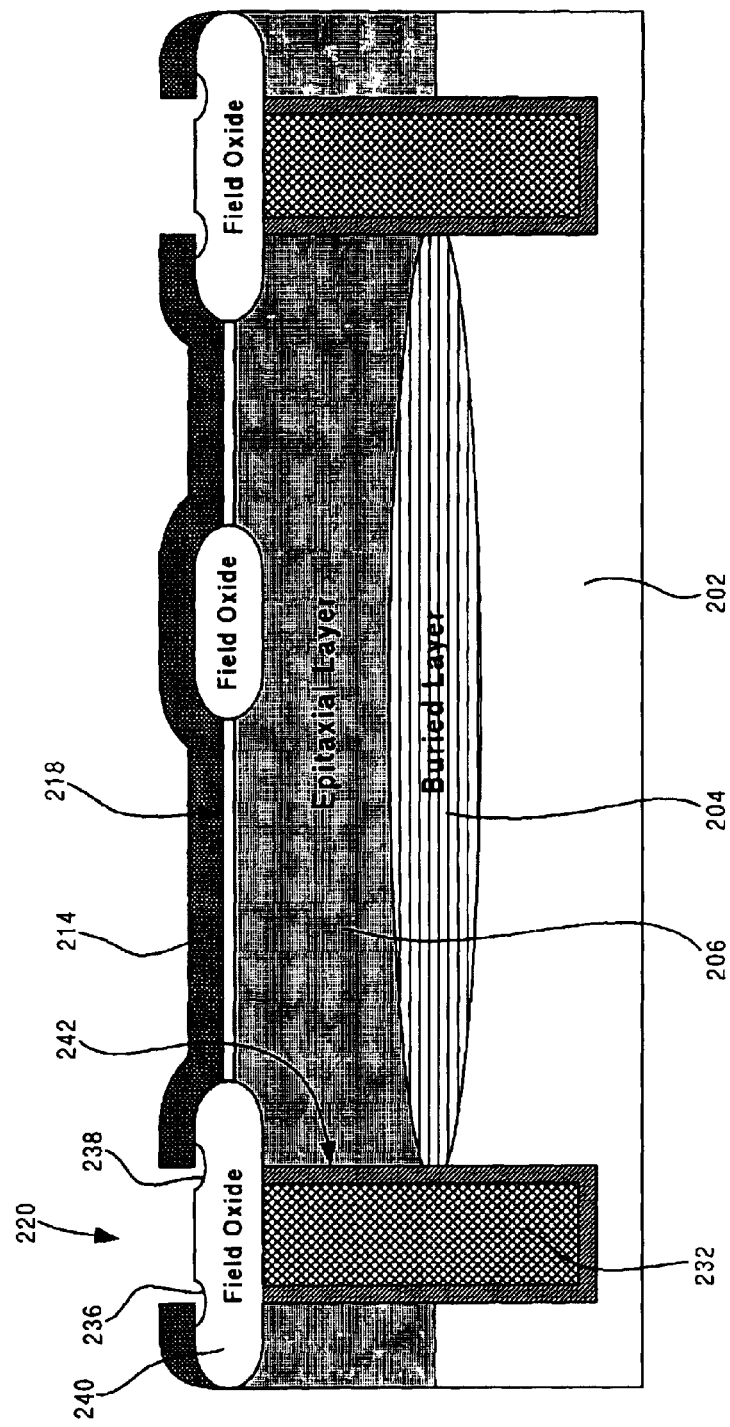
FIG. 2G illustrates cross-sectional views, which include portions of a wafer processed according to an embodiment of the invention, corresponding to certain steps of the flowchart in FIG. 1.

Referring to step 162 in FIG. 1 and structure 262 in FIG. 2G, at step 162 of flowchart 100, oxide liner 228 situated on sidewalls 222 and 224 of trench 220 and on nitride layer 214 is removed and oxide is grown inside trench 220 to form continuous field oxide region 240. Oxide liner 228 can be removed by a wet strip utilizing a buffered oxide etchant ("BOE") using an HF+NH4F chemistry, for example. As a result of the wet strip, undercutting can occur in field oxide portions 209 and 211. Undercutting in field oxide portions 209 and 211 can create cavities 236 and 238 in field oxide region 240, which is formed when field oxide portions 209 and 211 are joined by oxide grown in trench 220.

As discussed above, in the process of the present invention, hard mask 216 is removed at step 156. Consequently, hard mask 216 has already been removed when oxide liner 228 is removed at step 162. Thus, as a result of prior removal of hard mask 216 in the invention's process, in the BOE wet strip discussed above, only densified oxide in oxide liner 228, e.g. approximately 1000.0 Angstroms of densified oxide, is removed. As a result, the present invention advantageously achieves a process that results in minimal undercutting of field oxide portions 209 and 211. Thus, by minimizing undercutting of field oxide portions 209 and 211, the present invention provides a corresponding reduction in size of cavities, such as cavities 236 and 238, formed in the top surface of field oxide region 240.

In contrast, in a conventional process, the hard mask is generally removed after the polysilicon recess etch, which occurs at step 160. In addition, in the conventional process, the oxide liner is removed with the hard mask, which increases the thickness of the material that must be removed in an etching process. Furthermore, since, in the conventional process, the hard mask has a non-uniform thickness as a result of hard mask etching that occurs during trench etching at step 154, the material to be removed has a non-uniform thickness as well as an overall increased thickness. As a result, in the conventional process, a wet strip, such as a BOE wet strip, cannot be used to remove the hard mask and oxide liner without causing severe field oxide undercutting. Thus, in the conventional process, a dry etch process is used to remove the hard mask and oxide liner. However, the dry etch process results in formation of undesirable deep cavities in the top surface of the field oxide situated above the deep trench isolation region.

As a result of the process of the present invention, undercutting in field oxide portions 209 and 211 is significantly reduced in contrast to undercutting that occurs in a conventional process. As a result, the present invention's process achieves effective hard mask removal, which results in a substantial decrease in depth of cavities, such as cavities 236 and 238, formed in the top surface of field oxide region 240.

After oxide liner 228 is removed, approximately 3000.0 Angstroms of oxide, for example, is grown in trench 220. As a result, the oxide grown in trench 220 merges with field oxide portions 209 and 211 to form continuous field oxide region 240 over deep trench isolation region 242. A subsequent step of removing nitride layer 214 can be performed as known in the art. The result of step 162 of flowchart 100 is illustrated by structure 262 in FIG. 2G.

As a result of the process of the present invention, a hard mask is effectively removed during formation of deep trench isolation region 242. Furthermore, by effectively removing the hard mask prior to a polysilicon recess etch, the present invention achieves a deep trench isolation process that results in formation of minimal size cavities in the top surface of field oxide region 240 situated over deep trench isolation region 242.

It is appreciated by the above detailed description that the invention provides method for effectively removing a hard mask during formation of deep trench isolation regions in a substrate. Furthermore, the method of the present invention achieves reduced size cavity formation in field oxide regions situated directly over deep trench isolation regions. From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, method for hard mask removal for deep trench isolation and related structure have been described.

What is claimed is:

1. A method for removing a hard mask in a deep trench isolation process, said method comprising steps of:

depositing a nitride layer over a substrate, said substrate including at least one field oxide region;

forming a hard mask over said nitride layer;

forming a trench in said substrate, said trench having a first sidewall and a second sidewall;

removing said hard mask after said forming said trench, wherein said removing said hard mask includes etching said hard mask in an anisotropic dry etch process, said anisotropic dry etch process being selective to nitride and silicon;

depositing by a CVD process an oxide liner on said first and second sidewalls of said trench and over said substrate after said removing said hard mask.

2. The method of claim 1 further comprising a step of removing said oxide liner using a wet strip process.

3. The method of claim 1 wherein said step of forming said trench in said substrate comprises steps of:

forming a photoresist mask on said hard mask;

etching a trench to an initial depth;

removing said photoresist mask;

etching said trench to a final depth.

4. The method of claim 1 wherein said step of forming said trench in said substrate comprising etching through said at least one field oxide region.

5. The method of claim 1 further comprising a step of forming a photoresist mask on said hard mask after said step of forming said hard mask and prior to said step of forming said trench in said substrate.

6. The method of claim 1 wherein said oxide liner comprises densified TEOS oxide.

7. The method of claim 1 wherein said hard mask is selected from the group consisting of densified TEOS oxide and HDP oxide.

* * * * *